US011760870B2

United States Patent
Oi et al.

(10) Patent No.: US 11,760,870 B2
(45) Date of Patent: Sep. 19, 2023

(54) RESIN COMPOSITION FOR ENCAPSULATION

(71) Applicant: NAGASE CHEMTEX CORPORATION, Osaka (JP)

(72) Inventors: Yosuke Oi, Hyogo (JP); Takashi Hiraoka, Hyogo (JP)

(73) Assignee: NAGASE CHEMTEX CORPORATION, Osaka (JP)

( * ) Notice: Subject to any disclaimer, the term of this patent is extended or adjusted under 35 U.S.C. 154(b) by 0 days.

(21) Appl. No.: 16/963,292

(22) PCT Filed: Jan. 23, 2019

(86) PCT No.: PCT/JP2019/002010
§ 371 (c)(1),
(2) Date: Jul. 20, 2020

(87) PCT Pub. No.: WO2019/146617
PCT Pub. Date: Aug. 1, 2019

(65) Prior Publication Data
US 2021/0054187 A1 Feb. 25, 2021

(30) Foreign Application Priority Data

Jan. 23, 2018 (JP) ................................ 2018-008661

(51) Int. Cl.
| | | |
|---|---|---|
| *C08L 63/00* | (2006.01) | |
| *C08G 59/42* | (2006.01) | |
| *C08G 59/50* | (2006.01) | |
| *C08G 59/62* | (2006.01) | |
| *C08K 3/36* | (2006.01) | |
| *C08K 5/06* | (2006.01) | |
| *C08K 7/18* | (2006.01) | |

(52) U.S. Cl.
CPC ............. *C08L 63/00* (2013.01); *C08G 59/42* (2013.01); *C08G 59/50* (2013.01); *C08G 59/621* (2013.01); *C08K 3/36* (2013.01); *C08K 5/06* (2013.01); *C08K 7/18* (2013.01); *C08L 2203/206* (2013.01)

(58) Field of Classification Search
CPC ... C08L 63/00; C08L 2203/206; C08G 59/42; C08G 59/50; C08G 59/621; C08K 3/36; C08K 5/06; C08K 7/18

USPC ........................................................ 523/400
See application file for complete search history.

(56) References Cited

U.S. PATENT DOCUMENTS

| | | | |
|---|---|---|---|
| 2014/0205843 A1* | 7/2014 | Beisele | H01B 3/427 428/413 |
| 2020/0181392 A1 | 6/2020 | Inoue et al. | |

FOREIGN PATENT DOCUMENTS

| | | | | |
|---|---|---|---|---|
| JP | S61-089247 A | | 5/1986 | |
| JP | S62-210653 A | | 9/1987 | |
| JP | 11193369 A | * | 7/1999 | ............ C09J 163/00 |
| JP | H11-199651 A | | 7/1999 | |
| JP | 2002-076203 A | | 3/2002 | |
| JP | 2004-018786 A | | 1/2004 | |
| JP | 2006-176678 A | | 7/2006 | |
| JP | 2007-314702 A | | 12/2007 | |
| JP | 2012-162585 A | | 8/2012 | |
| JP | 2012-224758 A | | 11/2012 | |
| JP | 2017-201654 A | | 11/2017 | |
| WO | WO-2017027482 A1 | * | 2/2017 | ......... C08G 59/4042 |
| WO | 2018/221682 A1 | | 12/2018 | |
| WO | 2018221682 A1 | | 12/2018 | |

OTHER PUBLICATIONS

Iida et al., JP 11-193369 A machine translation in English, Jul. 21, 1999 (Year: 1999).*
WIPO, International Search Report for PCT Application No. PCT/JP2019/002010, dated Apr. 10, 2019.
WIPO, International Preliminary Report on Patentability including Written Opinion for PCT Application No. PCT/JP2019/002010, dated Apr. 16, 2019.
Intellectual Property Office, Ministry of Economic Affairs, Notice of Examination Opinions for Taiwanese patent application No. 108102549, dated Jul. 25, 2022.
Japan Patent Office, Office Action for Japanese Patent Application No. 2019-567101, dated Dec. 6, 2023.

* cited by examiner

*Primary Examiner* — David T Karst

(57) ABSTRACT

An object of the present invention is to provide a resin composition for encapsulation capable of suppressing warpage even when a large-area substrate is encapsulated.
In order to solve the above problems, a resin composition for encapsulating an electronic member containing an epoxy resin (A), a compound having a polyalkylene glycol chain (B), and an inorganic filler (C) is provided.
Thus, even when a large-area substrate is encapsulated, an effect of suppressing the warpage can be obtained.

6 Claims, No Drawings

RESIN COMPOSITION FOR ENCAPSULATION

TECHNICAL FIELD

The present invention relates to a resin composition for encapsulating an electronic member. More specifically, the present invention relates to a resin composition for encapsulating an electronic member such as a wafer or a panel having a large area.

BACKGROUND OF THE INVENTION

An electronic member typified by a semiconductor or the like needs to be encapsulated with a curable material such as an epoxy resin in order to protect it from heat, light, moisture, dust, physical impact, and the like.

In recent years, for the purpose of drastically reducing the cost of semiconductor packaging, a technique of encapsulating a large-area substrate and then performing singulation of the substrate before cutting a wafer on which a semiconductor circuit is formed into individual chips has been known (Patent Document 1).

PRIOR ART DOCUMENT

Patent Document

[Patent Document 1]: JP-A-2017-201654

SUMMARY OF THE INVENTION

Problem to be Solved by the Invention

When a large-area substrate is entirely encapsulated with a thermosetting resin, large warpage occurs due to a difference in the thermal expansion coefficient between the substrate and the thermosetting resin. If the warpage is large, problems arise in the subsequent polishing process and singulation process, Thus, the prevention of the warpage is a major technical problem.

Therefore, an object of the present invention is to provide a resin composition for encapsulation capable of suppressing the warpage even when a large-area substrate is for encapsulated.

Means for Solving the Problems

As a result of intensive studies on the above-mentioned problems, the inventors have found that warpage can be suppressed even when a substrate, particularly a substrate having an area of 7000 $mm^2$ or more, is encapsulated by using a specified compound having an epoxy resin and a polyalkylene glycol chain in an epoxy resin composition, thereby completing the present invention.

That is, the present invention provides the following resin composition for encapsulation.

The resin composition for encapsulation of the present invention for solving the above problems is characterized in that a resin composition for encapsulation including an epoxy resin (A), a compound having a polyalkylene glycol chain (B), and an inorganic filler (C), wherein the compound having a polyalkylene glycol chain (B) is a compound represented by (B-1) and/or (B-2) below.

(B-1) An epoxy having a polyalkylene glycol chain resin including an alkylene glycol repeating unit having 2 or more carbon atoms, and the number of the repeating unit being 5 or more (excluding the above component (A), and in the case where the above alkylene glycol having 2 or more carbon atoms is ethylene glycol alone, the number of the repeating unit is 10 or more).

(B-2) A Polyalkylene glycol having alkylene glycol repeating units having 2 or more carbon atoms and having the number average molecular weight of 1500 or more (excluding the above component (B-1)).

According to this feature, even when a large-area substrate is encapsulated, the warpage of the substrate can be suppressed.

According to one embodiment of the resin composition for encapsulation of the present invention, the epoxy resin of the component (A) includes one or more selected from trimethylolpropane triglycidyl ether, glycidylamine epoxy resin, bisphenol A epoxy resin, bisphenol F epoxy resin, alicyclic epoxy resin, and naphthalene epoxy resin. According to this feature, it is possible to further suppress the warpage of the large-area substrate.

According to one embodiment of the resin composition for encapsulation of the present invention, the content of the component (B) is 3 to 100 parts by mass based on 100 parts by mass of the component (A).

According to this feature, it is possible to further suppress the warpage of the large-area substrate.

According to one embodiment of the resin composition for encapsulation of the present invention, the polyalkylene glycol chain of the component (B) includes one or more selected from a polyethylene glycol chain, a polypropylene glycol chain, and a polytetramethylene glycol chain.

According to this feature, it is possible to exhibit a lower warpage property in the resin composition for encapsulation.

According to one embodiment of the resin composition for encapsulation of the present invention, the component (B-2) has only a polypropylene glycol chain, and both ends of the component (B-2) are hydroxyl groups.

According to this feature, it is possible to exhibit a lower warpage property in the resin composition for encapsulation.

According to one embodiment of the resin composition for encapsulation of the present invention, the resin composition includes a curing agent (D) and/or a curing accelerator (E).

According to this feature, it is possible to efficiently cure the epoxy resin while maintaining low warpage.

Further, according to one embodiment of the resin composition for encapsulation of the present invention, the content of the filler (C) is 60 mass % or more in the composition. According to this feature, heat resistance can be improved while maintaining low warpage.

According to one embodiment of the resin composition for encapsulation of the present invention, the filler (C) is a spherical silica particle.

According to this feature, it is possible to improve the molding fluidity while maintaining the low warpage property.

According to one embodiment of the resin composition for encapsulation of the present invention, the resin composition for encapsulation is in a liquid state.

According to this feature, it is possible to use a molding method such as compression molding or the like, and it is possible to encapsulate up to the end part of the large-area substrate.

Further, according to an embodiment of the resin composition for encapsulation of the present invention, the resin composition for encapsulation is characterized in that a resin composition for encapsulation used for encapsulating an electronic member having an area of 7000 $mm^2$ or more.

According to this feature, even encapsulating an electronic member having an area of 7000 mm$^2$ or more, it is possible to encapsulate without warpage.

EFFECT OF THE INVENTION

According to the present invention, it is possible to provide a resin composition for encapsulation capable of suppressing the warpage of a substrate even when a large-area substrate is encapsulated.

Forms for Implementing the Invention

Next, the best mode for carrying out the present invention will be explained.
[Resin Composition for Encapsulation]

The resin composition for encapsulation of the present invention is characterized in that it includes an epoxy resin (A), a compound having a polyalkylene glycol chain (B), and a filler (C).

Next, each component used in the resin composition for encapsulation of the present invention will be described in detail.
<(A) Epoxy Resin>

As the epoxy resin (A) in the present invention, an epoxy resin used as an encapsulating material can be used, and it is preferable a multifunctional epoxy resin having 2 or more functional groups.

Multifunctional epoxy resins include mononuclear aromatic epoxy resins with one benzene ring, such as catechol diglycidyl ether, resorcinodiglycidyl ether, phthalic acid diglycidyl ether, 2,5-diisopropyl hydroquinone diglycidyl ether, and hydroquinone diglycidyl ether; alicyclic epoxy resins, such as 3',4'-epoxycyclohexylmethyl-3,4-epoxycyclohexancarboxylate, 3',4'-epoxy-6-methylcyclohexylmethyl-3,4-epoxy-6-methylcyclohexylcarboxylate, bis(3,4-epoxycyclohexyl)adipate, vinylcyclohexene monoepoxide, diepoxy limonene, bisphenol epoxy resins, such as bisphenol A, bisphenol F, bisphenol AD and bisphenol S, and oligomer mixtures in which bisphenol epoxy resins are partially condensed, nuclear hydrogenated epoxy resins of bisphenol epoxy resins; tetramethyl bis(4-hydroxyphenyl) methane diglycidyl ether, tetramethyl bis(4-hydroxyphenyl) ether diglycidyl ether; biphenyl or tetramethyl biphenyl epoxy resins, nuclear hydrogenated epoxy resins thereof; fluorene epoxy resins such as bisphenol fluorene epoxy resins, biscresol fluorene epoxy resins; and naphthalene epoxy resins.

Further, the multifunctional epoxy resin includes, for example, an aminophenol epoxy resin such as triglycidyl-p-aminophenol (p-aminophenol epoxy resin), an aniline epoxy resin such as diglycidyl aniline, a toluidine epoxy resin such as diglycidyl orthotoluidine, a multifunctional glycidyl amine epoxy resin, such as a diamino diphenylmethane epoxy resin such as tetraglycidyl diamino diphenylmethane, dicyclopentadiene epoxy resin; trimethylol alkane epoxy resin such as a trimethylolpropane triglycidyl ether, a trimethylol methyl triglycidyl ether, a trimethylolethane triglycidyl ether and the like.

Other epoxy resins, for example, silylated epoxy resin, heterocyclic epoxy resin, diallyl bisphenol A epoxy resin, polyarylene ether, diglycidyl ether, and the like can also be used in a combination. Among these, it is preferable to include one or more selected from trimethylolpropane triglycidyl ether, glycidyl amine epoxy resin, bisphenol A epoxy resin, bisphenol F epoxy resin, alicyclic epoxy resin, and naphthalene epoxy resin, and from the standpoint of exhibiting excellent low warpage property, glycidyl amine epoxy resin is preferable. It is further preferable to include one or more selected from p-aminophenyl epoxy resin, diamino diphenylmethane epoxy resin, and diglycidyl orthotoluidine. These may be used alone or in a combination of two or more.

In the resin composition for encapsulation, the content of the epoxy resin (A) is, for example, 1 mass % or more and 25 mass %. The lower limit value is preferably 2 mass % or more, more preferably 5 mass % or more. The upper limit value is preferably 20 mass % or less, more preferably 15 mass % or less.
<(B) Compounds with Polyalkylene Glycol Chain>

The resin composition for encapsulation of the present invention is characterized in that it includes a compound having a polyalkylene glycol chain (B).

The compound having the polyalkylene glycol chain (B) in the present invention includes an epoxy resin having a polyalkylene glycol chain (B-1) and/or a polyalkylene glycol (B-2).
(B-1) Epoxy Resin Having a Polyalkylene Glycol Chain The epoxy resin having a polyalkylene glycol chain (B-1) in the present invention is different from the epoxy resin of the component (A).

Further, the epoxy resin having a polyalkylene glycol chain (B-1) in the present invention has an alkylene glycol repeating unit having 2 or more carbon atoms, and the number of the repeating unit is 5 or more (in the case where the alkylene glycol having 2 or more carbon atoms is polyethylene glycol alone, the number of the repeating unit is 10 or more).

The alkylene glycol repeating unit having 2 or more carbon atoms includes an ethylene glycol unit, a propylene glycol unit, a butylene oxide unit, a tetramethylene glycol unit, a hexamethylene glycol unit, an octamethylene glycol unit, a decamethylene glycol unit, and the like. These units may be alone or may include two or more types of units. When two or more types of units are included, a random type or a block type may be used.

As an epoxy resin having a polyalkylene glycol chain, an epoxy resin having a polyalkylene glycol chain in its main chain is preferable, and examples thereof include an alkylene glycol diglycidyl ether, such as polyethylene glycol diglycidyl ether, polypropylene glycol diglycidyl ether, polytetramethylene glycol diglycidyl ether, polyhexamethylene glycol diglycidyl ether, polyethylene glycol polypropylene glycol diglycidyl ether, or the like. Other examples of epoxy resins having polyalkylene glycol chains include epoxy resins of phenol adduct such as diglycidyl ether of bisphenol A propylene oxide adduct, diglycidyl ether of bisphenol F propylene oxide adduct, diglycidyl ether of bisphenol S propylene oxide adduct, and the like.

In the epoxy resin having a polyalkylene glycol chain (B-1) in the present invention, the number of the alkylene glycol chain having 2 or more carbon atoms is 5 or more. Preferably, it is 6 or more, more preferably 7 or more, particularly preferably 8 or more. The upper limit value is not particularly limited, but is preferably 200 or less, more preferably 100 or less, and still more preferably 70 or less.

However, in the case where the alkylene glycol having 2 or more carbon atoms is polyethylene glycol alone, the number of repeating units is 10 or more. More preferably, it is 15 or more, and more preferably 20 or more. The upper limit value is not particularly limited, but is preferably 300 or less, more preferably 200 or less, and still more preferably 100 or less.

When the number of repeating alkylene glycol chains having 2 or more carbon atoms is 5 or more (however, in the case where the alkylene glycol having 2 or more carbon atoms is polyethylene glycol alone, the number of repeating units is 10 or more), excellent low warpage property can be exhibited even for a large-area substrate.

The epoxy resin having a polyalkylene glycol chain (B-1) can be obtained by purchasing a commercially available product or obtained by chemical reaction of reacting an epoxidizing agent such as epichlorohydrin with the polyalkylene glycol having a hydroxyl group at the end of the polyethylene glycol, polypropylene glycol, polytetramethylene glycol, or the like.

(B-2) Polyalkylene Glycol

The polyalkylene glycol (B-2) in the present invention has alkylene glycol repeating units having 2 or more carbon atoms and has the number average molecular weight of 1500 or more. The lower limit value is preferably 2000 or more, more preferably 3000 or more, and still more preferably 4000 or more. The upper limit value is, for example, 6000 or less, and can be 5000 or less.

When the component including a polyalkylene glycol having an alkylene glycol repeating unit having 2 or more carbon atoms (B-2) and having the number average molecular weight of 1500 or more, excellent low warpage can be exhibited even for a large-area substrate.

The polyalkylene glycol (B-2) in the present invention does not include the epoxy resin having a polyalkylene glycol chain (B-1).

In the polyalkylene glycol (B-2) in the present invention, the number of the alkylene glycol repeating units having 2 or more carbon atoms is preferably 25 or more. The lower limit value is more preferably 34 or more, still more preferably 51 or more, and particularly preferably 68 or more.

The upper limit value is preferably 100 or less, more preferably 80 or less.

The alkylene glycol repeating unit having 2 or more carbon atoms is the same as that described in (B-1) above, and more preferably is a propylene glycol unit.

In the component (B-2) of the present invention, the terminal structure is not particularly limited as long as it is a structure other than an epoxy group, preferably one or more selected from a hydroxyl group, a carboxyl group, an amino group, an alkoxy group or the like, more preferably a compound that both ends are hydroxyl groups.

The polyalkylene glycol (B-2) can be obtained by purchasing a commercial product or polymerizing an alkylene oxide monomer.

The total content of the epoxy resin (A) and the compound having polyalkylene glycol chain (B) in the resin composition for encapsulation is, for example, 2 mass % or more and 30 mass % or less.

The lower limit value is preferably 3 mass % or more, more preferably 5 mass % or more.

The upper limit value is preferably 25 mass % or less, more preferably 20 mass % or less.

The content of the compound having the polyalkylene glycol chain (B) based on 100 parts by mass of the epoxy compound resin (A) is, for example, 3 parts by mass or more and 100 parts by mass or less. The lower limit value is preferably 10 parts by mass or more, more preferably 20 parts by mass or more. The upper limit value is preferably 70 parts by mass or less, more preferably 40 parts by mass or less.

When the content of the epoxy resin having the polyalkylene glycol chain (B) is within the above range, a lower warpage property can be exhibited for a large-area substrate.

<(C) Filler>

The resin composition for encapsulation of the present invention is characterized by including (C) a filler.

The filler used in the present invention is not particularly limited, but includes silica such as fused silica or crystalline silica, alumina, talc, calcium carbonate, titanium white, red oxide (Bengala), silicon carbide, boron nitride (BN), glass beads, and the like. These may be used alone or in a combination of two or more kinds.

From the viewpoint of reducing the coefficient of thermal linear expansion of the cured product, it is preferable to use silica powder, and among the silica powders, and it is more preferable to use fused silica powder.

Examples of the fused silica powder include spherical fused silica powder and crushed fused silica powder, from the viewpoint of fluidity, it is particularly preferable to use spherical fused silica powder, and it is more preferably a silica powder having high sphericity.

By using the silica powder, the internal stress of the cured product can be reduced, and the warpage of the large-area substrate can be further suppressed.

The filler used in the present invention preferably has an average particle size in the range of 0.1 to 30 µm, for example.

The average particle diameter is obtained as the particle diameter (D50) at a cumulative volume of 50% of the volume particle size distribution.

For example, a sample arbitrarily extracted from a population can be used and can be derived by measurement using a laser diffraction scattering type particle size distribution measurement apparatus.

The content of the filler in the present invention is, for example, 60 to 95 mass % in the resin composition for encapsulation. The lower limit value is preferably 73 mass % or more, more preferably 76 mass % or more. The upper limit value is preferably 93 mass % or less, more preferably 90 mass % or less.

When the content of the filler is 60 to 95 mass %, the warpage suppressing effect of the molded product is large, and fluidity suitable for molding can be imparted.

As the filler, a filler in which a silane coupling agent is reacted on a surface in advance can be used. By using the filler in which a silane coupling agent is reacted on the surface, dispersibility in the resin composition can be improved.

When the silane coupling agent is used, the blending amount is preferably 0.05 to 5 parts by mass, more preferably 0.1 to 3 parts by mass, based on 100 parts by mass of the filler.

Furthermore, the resin composition for encapsulation of the present invention may preferably include a curing agent (D) and/or a curing accelerator (E).

<(D) Curing Agent>

The curing agent used in the resin composition for encapsulation of the present invention is not particularly limited, but includes an amine compound (amine curing agent), a phenol compound (phenol curing agent), an acid anhydride (acid anhydride curing agent), and the like.

As the phenolic compounds, condensation polymerization products of phenols or naphthols (e.g., phenol, cresol, naphthol, alkylphenol, bisphenol, terpen phenol, etc.) and formaldehyde are preferably used, examples include phenolic novolac, o-cresol novolac, p-cresol novolac, α-naphthol novolac resin, β-naphthol novolac resin, t-butyl phenol novolac, dicyclopentadiene cresol, polyparavinylphenol, bisphenol A novolac, xylene-modified novolac, decalinmodified novolac, poly(di-o-hydroxyphenyl)methane, poly (di-m-hydroxyphenyl)methane, and poly(di-p-hydroxyphenyl)methane and the like.

Examples of the acid anhydride include alkyl tetrahydro phthalic anhydrides such as phthalic anhydride, hexahydro phthalic anhydride, methyl hexahydro phthalic anhydride, tetrahydro phthalic anhydride, trialkyl tetrahydro phthalic anhydride, 3-methyl tetrahydro phthalic anhydride, and the like, and anhydrous himic acid, succinic anhydride, trimellitic anhydride, pyromellitic anhydride, and the like. These may be used alone or in a combination of two or more kinds. Among these, methyltetrahydro phthalic anhydride, methylhexahydro phthalic anhydride, and the like are preferable.

The amine compound is not particularly limited, and for example, tetramethyl diamino diphenylmethane, tetraethyl diamino diphenylmethane, diethyldimethyl diamino diphenylmethane, dimethyl diamino toluene, diamino dibutyl toluene, diamino dipropyl toluene, diamino diphenyl sulfone, diamino ditoryl sulfone, diethyl diamino toluene, bis(4-amino-3-ethylphenyl)methane, polytetramethylene oxide-di-p-aminobenzoate, or the like can be used. These may be used alone or in a combination of two or more kinds.

The content of the curing agent (D) is not particularly limited, but is preferably an amount in which the number of equivalents of the functional group of the curing agent is 0.05 to 1.5 to the equivalent of the epoxy group, and more preferably an amount in which the number of equivalents of the functional group of the curing agent is 0.1 to 1.2.

The curing agent (D) need not necessarily be blended when it includes a self-polymerization reaction accelerator as the curing accelerator (E). The content in the case of blending is not particularly limited, but preferably, (D) is 150 parts by mass or less based on 100 parts by mass of the epoxy resin (A). The upper limit value is, from the viewpoint of increasing the ratio of the self-polymerization reaction by the self-polymerization reaction accelerator, the curing agent is substantially not included or included preferably 30 parts by mass or less, more preferably 20 parts by mass or less, more preferably 10 parts by mass or less, particularly preferably 5 parts by mass or less, and particularly preferably 1 part by mass or less, When the content of the curing agent is (A) 150 parts by mass or less based on 100 parts by mass of the epoxy resin, excellent low warpage can be exhibited.

<(E) Curing Accelerator>

The resin composition for encapsulation of the present invention may preferably include a curing accelerator (E). Examples of the curing accelerator include an amine compound such as an imidazole compound, a phosphorus compound, and a basic compound such as an organometallic compound, preferably a self-polymerization reaction accelerator capable of self-polymerizing an epoxy resin, and particularly preferably an imidazole compound. The curing accelerator may be a latent curing accelerator, and a microencapsulated curing accelerator is preferable.

The above imidazole compounds include imidazole, substituted imidazol compounds such as 2-methylimidazole, 2-ethylimidazole, 1-isobutyl 2-methylimidazole, 2-ethyl-4-methylimidazole, 2-phenylimidazole, 2-phenyl-4-methylimidazole, 1-benzyl-2-methylimidazole, 1-benzyl-2-phenylimidazole, 1,2-dimethylimidazol, 1-cyanoethyl-2-methylimidazole, 1-cyanoethyl-2-ethyl-4-methylimidazole, 1-cyanoethyl-2-undecylimidazole,1-cyanoethyl-2phenylimidazol, trimellitates such as 1-cyanoethyl-2-undecylimidazolium trimellitate and 1-cyanoethyl-2-phenylimidazolium trimellitate; triazine adducts such as 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine and 2,4-diamino-6-[2'-methylimidazolyl-(1')]-ethyl-s-triazine, 2,4-diamino-6-[2'-methylimidazolyl-(1')]-ethyl-s-triazine isocyanurate, 2-phenylimidazole isocyanurate, 2-methylimidazole isocyanurate, 2-phenyl-4,5-dihydroxymethylimidazole, and 2-phenyl-4-methyl-5-dihydroxymethylimidazole, and the like.

Examples of the phosphorus compound include a trialkylphosphine compound such as tributylphosphine and a triarylphosphine compound such as triphenylphosphine.

Examples of the amine compound include 2,4,6-tris(dimethyl aminomethyl)phenol, diethylamine, triethylamine, diethylenetetramine, triethylenetetramine and 4,4-dimethylaminopyridine. The amine compound may be an amine adduct.

Examples of the organometallic compound include zinc naphthenate, cobalt naphthenate, tin octylate, cobalt octylate, bis-acetylacetonate cobalt (II) and tris-acetylacetonate cobalt (III).

As the above microencapsulated curing accelerator, for example, a fine particulate composition or the like in which an amide compound powder is dispersed in an epoxy resin can be used. The amide compound is selected from the examples shown below based on the desired viscosity: aliphatic primary amines, alicyclic primary amines, aromatic primary amines, aliphatic secondary amines, alicyclic secondary amines, aromatic secondary amines, imidazole compounds, or imidazoline compounds, reaction products thereof with carboxylic acids, sulfonic acids, isocyanates, or epoxies, and the like. One or more of them can be used in a combination, for example, aliphatic primary amines, alicyclic primary amines, aromatic primary amines, aliphatic secondary amines, alicyclic secondary amines, aromatic secondary amines, imidazole compounds, or imidazoline compounds can be preferably used in a combination with reaction products thereof with carboxylic acids, sulfonic acids, isocyanates, or epoxies. The volume average particle diameter of the amine compound powder is preferably 50 µm or less, more preferably 10 µm or less. In addition, from the viewpoint of suppressing thickening at 25° C., the amine-based compound powder described above preferably has a melting point or a softening point of 60° C. or more.

In the resin composition for encapsulation of the present invention, the content of the curing accelerator (E) is, for example, 0.1 parts by mass or more and 40 parts by mass or less based on 100 parts by mass of the epoxy resin (A).

The lower limit value is preferably 1 part by mass or more, more preferably 5 parts by mass or more. The upper limit value is preferably 30 parts by mass or less, more preferably 20 parts by mass or less. By setting the content of the curing accelerator as described above, it is possible to suppress the warpage while suppressing the occurrence of curing failure.

<Other Additives>

Other additives can be used in the composition of the present invention as long as they do not interfere with the object of the present invention. Such additives include silane coupling agents, carbon black, ion scavengers, and the like. Silane couplings include, for example, 3-glycidoxypropyl trimethoxysilane, 3-glycidoxypropyl triethoxysilane, 2-(3,4-epoxycyclohexyl)ethyl trimethoxysilane, 2-(3,4-epoxycyclohexyl)ethyltriethoxysilane, vinyltrimethoxysilane, vinyltriethoxysilane, and the like.

The silane coupling agent may be blended, if desired, in the case of using silica in which a silane coupling agent has been reacted on the surface in advance.

The content of the silane coupling agent is preferably 0.1 to 10 mass %, more preferably 2 to 6 mass %, in the resin composition for encapsulation. The content of the carbon black is preferably 0.1 to 5 mass %, more preferably 0.5 to 3 mass % in the resin composition for encapsulation.

The ion scavenger is an agent having the ability to trap impurity ions in the resin composition for encapsulation, and the reliability of the encapsulated electronic member can be improved. Examples of the ion scavenger include an inorganic ion exchange agent and the like. The content of the ion scavenger in the case of including it is not particularly limited, but is preferably 0.05 mass % or more, more preferably 3 mass % or less in the resin composition for encapsulation.

[Method of Use of Resin Composition for Encapsulation]

The resin composition for encapsulation of the present invention can be used in the form of granular state, liquid state, sheet state, and the like. Hereinafter, a case of using it in a liquid state will be described.

<Resin Composition for Encapsulation of Liquid State>

The liquid state means a state having fluidity at 25° C., and for example, it is preferable that the viscosity is 2000 Pa. second or less at 25° C. and a shear rate of 2.5 (1/s).

The above viscosity is a value measured using HBT viscosity meter made by Brookfield, inc., if the values differ according to the measurement method. When the viscosity of the composition is 2000 Pa. second or less, wire sweep and filling failure are less likely to occur at the time of compression molding, and the resin supply at the time of manufacture proceeds smoothly.

The method of preparing the resin composition for encapsulation of liquid state is not particularly limited as long as it is a method in which each component is uniformly dispersed and mixed, and can be prepared by mixing by a conventional method. For example, each component can be combined in a predetermined ratio, stirred for 30 to 480 minutes, and then degassed under reduced pressure before use.

The curing condition of the resin composition for encapsulation of liquid state is not particularly limited, but in order to sufficiently progress the curing, heating (also referred to as pre-curing, or heating during molding) and post-curing are preferably performed.

The temperature and time of the heating (heating during molding) differ depending on the molding method, but are preferably 50 to 200° C., more preferably 70 to 180° C., and the time is preferably 3 seconds to 30 minutes, more preferably 2 to 15 minutes. In addition, heating (heating during molding) can be allowed to cure in multiple stages, for example, at 80 to 130° C. for 8 to 12 minutes, followed by 2 to 5 minutes of post-cure at 140 to 160° C.

Post-curing differs depending on heating conditions during molding and the like, but it is preferable to perform the post-curing at 80 to 200° C., and it is more preferable to perform the post-curing at 100 to 180° C. The post-curing time varies depending on the heating condition at the time of molding and the like, but 10 to 300 minutes is preferable, and 30 to 180 minutes is more preferable.

The present invention further includes a method of encapsulating an electronic member substrate such as a large-area panel or wafer using a resin composition for encapsulation of liquid state. As an encapsulating method, for example, a method includes a method performed by a compression molding. The compression molding method can be performed using a known compression molding machine or the like. Incidentally, the method of encapsulating is not limited to the compression molding method, but can be printing molding, transfer molding, a coating molding such as by a dispenser.

As the encapsulating conditions using the compression molding method, the pressure at the time of curing is preferably 0.5 to 10 MPa, and more preferably 1 to 5 MPa. The temperature of the mold can be appropriately set depending on the curing temperature.

<Encapsulating Member>

The resin composition for encapsulation of the present invention can be used for encapsulating an electronic member typified by a wafer or a panel. Further, preferably it is possible to perform encapsulation to the electronic member substrate such as a panel or a wafer having an area of 7000 mm$^2$ or more, and further, it is possible to perform encapsulation to the electronic member substrate such as a panel or a wafer having a large area of 30000 mm$^2$ or more. Among them, it is suitable for package encapsulation such as wafer-level package (WLP) and panel-level package (PLP). It is also possible to perform underfilling and overmolding simultaneously to the electronic member substrate mounted with a semiconductor element or the like (use as a mold underfill material).

The large-area electronic member substrate is intended to include a wafer having a diameter of 200 mm (8 inches) or more, and 300 mm square or more panels.

The encapsulation by the resin composition for encapsulation of the present invention is, for example, encapsulation of 90% or more of the substrate area, and can be single-sided encapsulation or double-sided encapsulation.

The wafer used in the present invention includes a silicon wafer, a sapphire wafer, a compound semiconductor wafer, a glass substrate, a resin substrate (a bismaleinimide triazine substrate, a polyimide resin substrate, a fluorine resin, or the like), a printed wiring substrate, and the like.

Wafer sizes include 100 mm (4 inches) wafers, 150 mm (6 inches) wafers, 200 mm (8 inches) wafers, 300 mm (12 inches) wafers, and the like.

The panel used in the present invention includes a glass substrate, a silicon substrate, a resin substrate (e.g., a bismaleinimide triazine substrate, a polyimide resin substrate, or a fluorine resin substrate), a compound semiconductor substrate, a printed wiring board, and the like, and the size thereof is, for example, 60 mm×220 mm, 100 mm×300 mm, or 300 mm square or more, which is a panel of 320 mm×320 mm or the like. Further, a panel of 400 mm square or more, a panel of 410 mm×515 mm, 508 mm×610 mm, 500 mm×510 mm, a panel of 610 mm×457 mm, a panel of 520 mm×640 mm, and the like are included.

The following examples are provided to illustrate the invention in further detail, but are not intended to limit the invention thereto.

Examples 1 to 26 and Comparative Examples 1 to 24

Compositions and contents (parts by mass) shown in Tables 1 to 6 were blended and mixed well at room temperature to obtain resin compositions for encapsulation.

Each resin composition for encapsulation was a liquid state at 25° C. In Tables 1 to 6, the numbers in parentheses after the substance names in (B-1) and (B-2) represent the number of the alkylene glycol repeating units or the number average molecular weight.

The content of the filler (C) is described in terms of the content (mass %) in the entire composition.

Next, the resin compositions for encapsulation were pre-cured by compression molding of 3 MPa molding pressures at 125° C. for 10 minutes, and then post-cured at 150° C. for 60 minutes to encapsulate the silicon wafer.

In Examples 1 to 14, 17 to 19 and Comparative Examples 1 to 12 and 17, encapsulation was performed on a silicon wafer having a diameter of 300 mm and a thickness of 775 μm so that the thickness of the resin composition after curing was 300 μm (the diameter of the resin composition for encapsulation layer was 294 mm).

In Examples 15 to 16, 20 to 26, and Comparative Examples 13 to 16, 18 to 23, encapsulation was performed on a silicon wafer having a diameter of 300 mm and a thickness of 300 μm so that the thickness of the resin composition after curing was 300 μm (the diameter of the resin composition for encapsulation layer was 294 mm).

The encapsulated substrates were evaluated in the following manner.

[Evaluation Method]

The silicon wafers encapsulated with the resin composition for encapsulation were evaluated by the following standards and methods.

After the above-mentioned post-curing, these were cooled to room temperature, and the warpages were evaluated based on the following criteria.

The measurement method used a laser displacement meter to measure the average of the difference in height between the center of the substrate side of the silicon wafer and the two points of the wafer end. The measurement values as the warpage amount, the evaluation was carried out under the following criteria.

○: Warpage is less than 9 mm.
x: Warpage is 9 mm or more.

In Table 6, the warpage amounts of Examples and Comparative Examples were compared and evaluated with the warpage amounts measured in Comparative Example 22 as 100.

TABLE 1

|  |  | Examples | | | | | Comparative Examples |
|---|---|---|---|---|---|---|---|
|  |  | 1 | 2 | 3 | 4 | 5 | 1 |
| (A)Epoxy resin | diamino diphenylmethan epoxy resin | 80 | | | | | 80 |
|  | diglycidyl orthotoluidine | 20 | | | | 30 | 20 |
|  | bisphenol F epoxy resin (liquid state) | | 100 | | | | |
|  | trimethylolpropane triglycidyl ether | | | 100 | | | |
|  | p-aminophenol epoxy resin | | | | 100 | 70 | |
| (B-1) | polytetramethylene glycol diglycidyl ether (n = 8 to 9) | 30 | 30 | 30 | 30 | 30 | |
| (E)Curing accelerator | 2-methylimidazol compound | 8 | 8 | 8 | 8 | 8 | 8 |
| Black colorant | Carbon black (particle size: 23 nm) | 1.5 | 1.5 | 1.5 | 1.5 | 2 | 1.5 |
|  | Total | 139.5 | 139.5 | 139.5 | 139.5 | 140 | 109.5 |
| (C)Filler | Spherical fused silica | 80.0 wt % | 80.0 wt % | 80.0 wt % | 80.0 wt % | 87.2 wt % | 80.0 wt % |
| Resin thickness/ Wafer thickness 300/775(μm) | Warpage (mm) | 0.8 | 6.8 | 3.1 | 0.7 | 0.2 | 9.1 |
|  | Evaluation | ○ | ○ | ○ | ○ | ○ | X |

|  |  | Comparative Examples | | | |
|---|---|---|---|---|---|
|  |  | 2 | 3 | 4 | 5 |
| (A)Epoxy resin | diamino diphenylmethan epoxy resin | | | | |
|  | diglycidyl orthotoluidine | | | | 30 |
|  | bisphenol F epoxy resin (liquid state) | 100 | | | |
|  | trimethylolpropane triglycidyl ether | | 100 | | |
|  | p-aminophenol epoxy resin | | | 100 | 70 |
| (B-1) | polytetramethylene glycol diglycidyl ether (n = 8 to 9) | | | | |

TABLE 1-continued

| (E)Curing accelerator | 2-methylimidazol compound | 8 | 8 | 8 | 8 |
|---|---|---|---|---|---|
| Black colorant | Carbon black (particle size: 23 nm) | 1.5 | 1.5 | 1.5 | 2 |
| | Total | 109.5 | 109.5 | 109.5 | 110 |
| (C)Filler | Spherical fused silica | 80.0 wt % | 80.0 wt % | 80.0 wt % | 87.2 wt % |
| Resin thickness/ Wafer thickness 300/775(μm) | Warpage (mm) | 9.5 | 12.3 | 10 | 9.4 |
| | Evaluation | X | X | X | X |

Table 1 shows that the resin compositions for encapsulation of Examples 1 to 5 containing epoxy resins having a polyalkylene glycol chain (B-1) exhibit an excellent low warpage effect compared to the resin compositions for encapsulation of Comparative Examples 1 to 5 which do not contain them. Furthermore, it was found that the resin composition for encapsulation of Example 1 containing diamino diphenylmethane epoxy resin and diglycidyl ortho-toluidine as epoxy resin (A), Example 4 containing p-aminophenol epoxy resin, and Example 5 containing diglycidyl orthotoluidine and p-aminophenol epoxy resin exhibited a more excellent low warpage effect.

TABLE 2

| | | Examples | | | | | Comparative Examples |
|---|---|---|---|---|---|---|---|
| | | 4 | 6 | 7 | 8 | 9 | 4 |
| (A)Epoxy resin | p-aminophenol epoxy resin | 100 | 100 | 100 | 100 | 100 | 100 |
| (B-1) | polytetramethylene glycol diglycidyl ether (n = 8 to 9) | 30 | 33 | 33 | 30 | | |
| | polytetramethylene glycol diglycidyl ether (n = 11) | | | | | 30 | |
| (E)Curing accelerator | 2-metlhylimidazol compound | 8 | | | | | 8 |
| | modified imidazol/ modified polyamine | | 20 | | | | |
| | amin adduct | | | 20 | | 20 | |
| | triethylenetetramine | | | | 8 | | |
| Black colorant | carbon black (particle size: 23 nm) | 1.5 | 1.5 | 1.5 | 1.5 | | 1.5 |
| | Total | 139.5 | 154.5 | 154.5 | 139.5 | 150 | 109.5 |
| (C)Filler | Spherical fused silica alumina | 80.0 wt % | 80.0 wt % | 80.0 wt % | 80.0 wt % | 85.0 wt % | 80.0 wt % |
| Resin thickness/ Wafer thickness 300/775(μm) | Warpage (mm) | 0.7 | 0.2 | 1.1 | 3.2 | 0.9 | 10 |
| | Evaluation | ○ | ○ | ○ | ○ | ○ | X |

| | | Comparative Examples | | | |
|---|---|---|---|---|---|
| | | 6 | 7 | 8 | 9 |
| (A)Epoxy resin | p-aminophenol epoxy resin | 100 | 100 | 100 | 100 |
| (B-1) | polytetramethylene glycol diglycidyl ether (n = 8 to 9) | | | | |
| | polytetramethylene glycol diglycidyl ether (n = 11) | | | | |
| (E)Curing accelerator | 2-metlhylimidazol compound | | | | |
| | modified imidazol/ modified polyamine | 20 | | | |
| | amin adduct | | 20 | | 20 |
| | triethylenetetramine | | | 8 | |
| Black colorant | carbon black (particle size: 23 nm) | 1.5 | 1.5 | 1.5 | |
| | Total | 121.5 | 121.5 | 109.5 | 120 |

TABLE 2-continued

| | | | | | |
|---|---|---|---|---|---|
| (C)Filler | Spherical fused silica alumina | 80.0 wt % | 80.0 wt % | 80.0 wt % | 85.0 wt % |
| Resin thickness/ Wafer thickness 300/775(μm) | Warpage (mm) Evaluation | 10.5 X | 10.1 X | 11.7 X | 14 X |

From Table 2, it was found that the resin compositions for encapsulation of Examples 4 and 6 to 9 containing (B-1) exhibited an excellent low warpage effect in comparison with the resin compositions for encapsulation of Comparative Examples 4 and 6 to 9 which do not contain them. In addition, it was found that the resin composition for encapsulation of Examples 4 and 6 containing an imidazole compound as a curing accelerator (E) exhibited more excellent low warpage effect.

TABLE 3

| | | | Examples | | | | | |
|---|---|---|---|---|---|---|---|---|
| | | | 10 | 5 | 11 | 12 | 13 | 14 |
| (A)Epoxy resin | diglycidyl orthotoluidine | | 30 | 30 | 30 | 30 | 30 | 30 |
| | p-aminophenol epoxy resin | | 70 | 70 | 70 | 70 | 70 | 70 |
| (B-1) | polytetramethylene glycol diglycidyl ether (n = 11) | | 30 | | | | | |
| | polytetramethylene glycol diglycidyl ether (n = 8 to 9) | | | 30 | | | | |
| | polypropylene glycol diglycidyl ether (n = 7 to 8) | | | | 30 | | | |
| | polypropylene glycol diglycidyl ether (n = 11) | | | | | 30 | | |
| | polypropylene glycol diglycidyl ether (n = 69) | | | | | | 30 | |
| | 1,6-hexandiol diglycidyl ether (n = 1) | | | | | | | |
| | polypropylene glycol diglycidy ether (n = 3) | | | | | | | |
| | polyethylene glycol diglycidyl ether (n = 22) | | | | | | | 30 |
| | polyethylene glycol diglycidyl ether (n = 9) | | | | | | | |
| (E)Curing accelerator | 2-methylimidazol compound | | 8 | 8 | 8 | 8 | 8 | 8 |
| Black colorant | Carbon black (particle size: 23 nm) | | 2 | 2 | 2 | 2 | 2 | 2 |
| | Total | | 140 | 140 | 140 | 140 | 140 | 140 |
| (C)Filler | Spherical fused silica | | 87.2 wt % | 87.2 wt % | 87.2 wt % | 87.2 wt % | 87.2 wt % | 87.2 wt % |
| Resin thickness/ Wafer thickness 300/775(μm) | Warpage (mm) Evaluation | | 0.1 ○ | 0.2 ○ | 0.7 ○ | 0.2 ○ | 0.5 ○ | 2.5 ○ |

| | | | Comparative Examples | | | |
|---|---|---|---|---|---|---|
| | | | 5 | 10 | 11 | 12 |
| (A)Epoxy resin | diglycidyl orthotoluidine | | 30 | 30 | 30 | 30 |
| | p-aminophenol epoxy resin | | 70 | 70 | 70 | 70 |
| (B-1) | polytetramethylene glycol diglycidyl ether (n = 11) | | | | | |
| | polytetramethylene glycol diglycidyl ether (n = 8 to 9) | | | | | |

TABLE 3-continued

| (A/B component) | | | | | |
|---|---|---|---|---|---|
| | polypropylene glycol diglycidyl ether (n = 7 to 8) | | | | |
| | polypropylene glycol diglycidyl ether (n = 11) | | | | |
| | polypropylene glycol diglycidyl ether (n = 69) | | | | |
| | 1,6-hexandiol diglycidyl ether (n = 1) | 30 | | | |
| | polypropylene glycol diglycidy ether (n = 3) | | | 30 | |
| | polyethylene glycol diglycidyl ether (n = 22) | | | | |
| | polyethylene glycol diglycidyl ether (n = 9) | | 30 | | |
| (E)Curing accelerator | 2-methylimidazol compound | 8 | 8 | 8 | 8 |
| Black colorant | Carbon black (particle size: 23 nm) | 2 | 2 | 2 | 2 |
| | Total | 110 | 140 | 140 | 140 |
| (C)Filler | Spherical fused silica | 87.2 wt % | 87.2 wt % | 87.2 wt % | 87.2 wt % |
| Resin thickness/Wafer thickness 300/775(μm) | Warpage (mm) | 9.4 | 13.4 | 11.8 | 12.7 |
| | Evaluation | X | X | X | X |

From Table 3, when Examples 5, 10 to 14 are compared with Comparative Examples 5 and 10, by containing (B-1), a low warpage effect can be exhibited. Further, when Examples 5 and 10 to 14 are compared with Comparative Examples 11 and 12, by containing specific (B-1), an excellent low warpage effect can be exhibited.

TABLE 4

| | | Examples | | | | | | |
|---|---|---|---|---|---|---|---|---|
| | | 15 | 16 | 4 | 17 | 10 | 18 | 19 |
| (A)Epoxy resin | diglycidyl orthotoluidine | | 20 | | | 30 | 30 | |
| | p-aminophenol epoxy resin | 100 | 80 | 100 | 100 | 70 | 70 | |
| | bisphenol A epoxy resin (liquid state) | | | | | | | 100 |
| (B-1) | polybutylene glycol diglycidyl ether (n = 8 to 9) | 35 | 30 | 30 | 35 | | | |
| | polybutylene glycol diglycidyl ether(n = 11) | | | | | 30 | 50 | 60 |
| | polyethylene glycol diglycidyl ether(n = 9) | | | | | | | |
| (E)Curing accelerator | S-methylimidazol compound | 8 | 4 | 8 | 8 | 8 | | |
| | dicyandiamide | | 6 | | | | | |
| | amin adduct | | | | | | 20 | |
| | phosphorus compounds | | | | | | | 2 |
| (D)Curing agent | methyl hexahydrophthalic anhydride | 20 | | | | | | 92 |
| | liquefied phenol | | | | 20 | | | |
| | solid phenol | | | | | | 25 | |
| Black colorant | Carbon black (particle size: 23 nm) | 1.5 | 2 | 1.5 | 1.5 | 2 | | |
| | Total | 164.5 | 142 | 139.5 | 164.5 | 140 | 195 | 254 |

TABLE 4-continued

| (C)Filler | Spherical fused silica | 80.0 wt % | 86.2 wt % | 80.0 wt % | 80.0 wt % | 87.2 wt % | 80.0 wt % | 80.0 wt % |
|---|---|---|---|---|---|---|---|---|
| Resin thickness/ Wafer thickness 300/300(μm) | Warpage (mm) Evaluation | 4.9 ○ | 0.9 ○ | | | | | |
| Resin thickness/ Wafer thickness 300/775(μm) | Warpage (mm) Evaluation | | | 0.7 ○ | 4.2 ○ | 0.1 ○ | 0.9 ○ | 5 ○ |

| | | | Comparative Examples | | | | |
|---|---|---|---|---|---|---|---|
| | | | 13 | 14 | 15 | 16 | 17 |
| (A)Epoxy resin | diglycidyl orthotoluidine | | | 30 | 30 | 20 | |
| | p-aminophenol epoxy resin | | 100 | 70 | 70 | 80 | 100 |
| | bisphenol A epoxy resin (liquid state) | | | | | | |
| (B-1) | polybutylene glycol diglycidyl ether (n = 8 to 9) | | | | | | |
| | polybutylene glycol diglycidyl ether(n = 11) | | | | | | |
| | polyethylene glycol diglycidyl ether(n = 9) | | | | | 30 | |
| (E)Curing accelerator | S-methylimidazol compound | | 8 | 8 | 4 | 4 | 8 |
| | dicyandiamide | | | | 6 | 6 | |
| | amin adduct | | | | | | |
| | phosphorus compounds | | | | | | |
| (D)Curing agent | methyl hexahydrophthalic anhydride | | 20 | | | | |
| | liquefied phenol | | | | | | 20 |
| | solid phenol | | | | | | |
| Black colorant | Carbon black (particle size: 23 nm) | | 1.5 | 2 | 2 | 2 | 1.5 |
| | Total | | 129.5 | 110 | 112 | 142 | 129.5 |
| (C)Filler | Spherical fused silica | | 80.0 wt % | 89.0 wt % | 89.0 wt % | 86.2 wt % | 80.0 wt % |
| Resin thickness/ Wafer thickness 300/300(μm) | Warpage (mm) Evaluation | | 9 X | 41.4 X | 45.8 X | >100 X | |
| Resin thickness/ Wafer thickness 300/775(μm) | Warpage (mm) Evaluation | | | | | | 9.3 X |

Looking at Table 4, it was found that the resin composites for encapsulation of Example 15 and 16 containing a specific (B-1) also exhibited an excellent lower warpage effect on wafers with 300 μm thickness in comparison with the resin composites for encapsulation of Comparative Examples 13 to 16 that do not contain them. Furthermore, comparing Examples 15 and 16, it was found that Example 16 containing only a curing accelerator had a lower warpage effect compared to Example 15 containing a curing agent.

When Examples 4 and 10 are compared with Examples 17 to 19, it was found that Examples 4 and 10 containing only a curing accelerator had a lower warpage effect than Examples 17 to 19 containing a curing agent.

TABLE 5

| | | | Examples | | | | | Comparative Examples | |
|---|---|---|---|---|---|---|---|---|---|
| | | | 20 | 21 | 22 | 23 | 4 | 18 | 4 |
| (A)Epoxy resin | diglycidyl orthotoluidine | | 30 | 30 | 30 | | | 30 | |
| | p-aminophenol epoxy resin | | 70 | 70 | 70 | 100 | 100 | 70 | 100 |
| (B-1) | polytetramethylene glycol diglycidyl ether (n = 8 to 9) | | 30 | 20 | 15 | 4 | 30 | | |

TABLE 5-continued

|  |  | Examples | | | | | Comparative Examples | |
|---|---|---|---|---|---|---|---|---|
|  |  | 20 | 21 | 22 | 23 | 4 | 18 | 4 |
| (E)Curing accelerator | 2-methylimidazol compound | 8 | 8 | 8 | 8 | 8 | 8 | 8 |
| Black colorant | Carbon black (particle size: 23 nm) | 2 | 2 | 2 | 1.5 | 1.5 | 2 | 1.5 |
| Ion scavenger | inorganic ion exchanger | 6 | 6 | 6 |  |  | 6 |  |
|  | Total | 146 | 136 | 131 | 113.5 | 139.5 | 116 | 109.5 |
| (C)Filler | Spherical fused silica | 89.0 wt % | 89.0 wt % | 89.0 wt % | 80.0 wt % | 80.0 wt % | 89.0 wt % | 80.0 wt % |
| Resin thickness/ Wafer thickness 300/300(μm) | Warpage (mm) Evaluation | 0.1 ○ | 2.1 ○ | 6.1 ○ | 8.8 ○ | 0.7 ○ | 41.4 X | 10 X |

Comparing Examples 4, 20 to 23 in Table 5, it was found that Examples 4 and 20 containing 30 parts by mass of (B-1) based on 100 parts by mass of (A) exhibited a lower warpage effect as compared with Examples 21 and 22 and Example 23.

From the results of Table 6, it was found that the resin compositions for encapsulation of Examples 24 to 26 containing polyalkylene glycol having the number average molecular weight of 1500 or more (B-2) exhibited an excellent low warpage effect even for wafers having a

TABLE 6

|  |  | Examples | | | Comparative Examples | | | |
|---|---|---|---|---|---|---|---|---|
|  |  | 24 | 25 | 26 | 19 | 20 | 21 | 22 |
| (A)Epoxy resin | naphthalene epoxy resin | 70 | 70 | 70 | 70 | 70 | 70 | 70 |
|  | alicyclic epoxy resin | 30 | 30 | 30 | 30 | 30 | 30 | 30 |
| (B-2) | both ends hydroxyl group modified polypropylene glycol (Mn 4160) | 40 |  |  |  |  |  |  |
|  | both ends hydroxyl group modified polypropylene glycol (Mn 3200) |  | 40 |  |  |  |  |  |
|  | both ends hydroxyl group modified polypropylene glycol (Mn 2000) |  |  | 40 |  |  |  |  |
|  | both ends hydroxyl group modified polypropylene glycol (Mn 1200) |  |  |  | 40 |  |  |  |
|  | both ends hydroxyl group modified polypropylene glycol (Mn 600) |  |  |  |  | 40 |  |  |
|  | both ends hydroxyl group modified polypropylene glycol (Mn 200) |  |  |  |  |  | 40 |  |
| (D)Curing agent | methyl hexahydrophthalic anhydride | 120 | 120 | 120 | 120 | 120 | 120 | 120 |
| Black colorant | Carbon black (particle size: 23 nm) | 3.6 | 3.6 | 3.6 | 3.6 | 3.6 | 3.6 | 3.6 |
| (E)Curing accelerator | latent imidazol compound | 20 | 20 | 20 | 20 | 20 | 20 | 20 |
|  | Total | 263.6 | 263.6 | 263.6 | 263.6 | 263.6 | 263.6 | 223.6 |
| (C)Filler | Spherical fused silica | 85.4 wt % | 85.4 wt % | 85.4 wt % | 85.4 wt % | 85.4 wt % | 85.4 wt % | 85.4 wt % |
| Resin thickness/ Wafer thickness 300/300(μm) | Warpage Evaluation | 36 | 36 | 61 | 171 | 164 | 121 | 100 | thickness of 300 µm, compared with the resin compositions for encapsulation of Comparative Examples 19 to 22 containing no polyalkylene glycol.

Next, a bleeding test was performed on the resin composition for encapsulation of Example 24 and the resin composition for encapsulation of Comparative Example 23 using silicone oil instead of the component (B) of Example 24.

As a test method, in the above test, the silicon wafer whose warpage was measured was split, and left to stand on a hot plate at 260° C. for 30 seconds with the silicon portion facing down, and then the wafer was visually subjected to the test.

As a result, in the resin composition for encapsulation of Example 24, bleeding was not observed, whereas in Comparative Example 23 using silicone oil, bleeding was observed.

From these results, it was found that the resin composition for encapsulation of the present invention exhibits an effect of maintaining the adhesive force at the interface between the wafer and the resin composition for encapsulation even after being exposed to a high-temperature environment because bleeding can be suppressed while exhibiting a low warpage effect.

INDUSTRIAL APPLICABILITY

The resin composition for encapsulation of the present invention is useful for encapsulating electronic members such as wafers and panels. Furthermore, it is possible to perform encapsulation to the electronic member substrate such as a panel or a wafer having an area of 7000 $mm^2$ or more, further it is possible to perform encapsulation to the electronic member substrate such as a panel or a wafer having a large area of 30000 $mm^2$ or more, it is more useful as an encapsulant.

Furthermore, the electronic member encapsulated with the resin composition for encapsulation of the present invention, a semiconductor device, a transistor (MOS transistor, a field effect transistor), a power semiconductor, a semiconductor memory, is useful in an image sensor or the like.

The invention claimed is:

1. A resin composition for encapsulation, which is cured by heating, comprising:
   (A) an epoxy resin,
   (B) a compound having a polyalkylene glycol chain,
   (C) an inorganic filler,
   (E) a curing accelerator,
   wherein the epoxy resin of the component (A) includes at least one selected from a group of trimethylolpropane triglycidyl ether, glycidylamine epoxy resin, bisphenol A epoxy resin, bisphenol F epoxy resin, and naphthalene epoxy resin,
   wherein the resin composition does not comprise a curing agent, and the compound having a polyalkylene glycol chain (B) is a compound represented by (B-1) below,
   (B-1) an epoxy resin having a polyalkylene glycol chain including an alkylene glycol repeating unit having 2 or 3 carbon atoms, and the number of the alkylene glycol repeating unit being 11 or more and 200 or less, and
   wherein excluding the component (A) in case where the alkylene glycol repeating unit having 2 or 3 carbon atoms is ethylene glycol alone, the number of the alkylene glycol repeating unit is 10 or more and 300 or less,
   the content of the component (B) is 10 parts by mass or more and 100 parts by mass or less, based on 100 parts by mass of the component (A),
   the curing accelerator (E) is at least one selected from a group of an imidazole compound, an amine adduct and triethylenetetramine, and
   the content of the inorganic filler (C) is 60 mass % or more and 90 mass % or less in the composition.

2. The resin composition for encapsulation according to claim 1, wherein the polyalkylene glycol chain of the component (B) includes at least one selected from a group of a polyethylene glycol chain and a polypropylene glycol chain.

3. The resin composition for encapsulation according to claim 1, wherein the inorganic filler (C) is spherical fused silica powder whose average particle size is in a range of 0.1 to 30 µm.

4. The resin composition for encapsulation according to claim 1, wherein the resin composition for encapsulation is in a liquid state.

5. The resin composition for encapsulation according to claim 1, wherein the resin composition for encapsulation is a resin composition for encapsulation used for encapsulating an electronic member having an area of 7000 $mm^2$ or more.

6. The resin composition for encapsulation according to claim 1, wherein the content of the inorganic filler (C) is 73 mass % or more in the resin composition for encapsulation.

* * * * *